United States Patent
Basin et al.

(10) Patent No.: US 8,431,423 B2
(45) Date of Patent: Apr. 30, 2013

(54) REFLECTIVE SUBSTRATE FOR LEDS

(75) Inventors: Grigoriy Basin, San Francisco, CA (US); Paul S. Martin, Singapore (SG)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 286 days.

(21) Appl. No.: 12/503,951

(22) Filed: Jul. 16, 2009

(65) Prior Publication Data

US 2011/0012149 A1 Jan. 20, 2011

(51) Int. Cl.
*H01L 33/00* (2010.01)

(52) U.S. Cl.
USPC ............ 438/26; 438/29; 257/98; 257/100; 257/E33.059; 257/E33.061; 257/E33.067

(58) Field of Classification Search ........... 257/98, 257/100, E33.059, E33.061, E33.067; 438/26, 438/29
See application file for complete search history.

(56) References Cited

U.S. PATENT DOCUMENTS

| | | | |
|---|---|---|---|
| 6,274,399 B1 | 8/2001 | Kern et al. | |
| 6,649,440 B1 | 11/2003 | Krames et al. | |
| 7,439,552 B2 * | 10/2008 | Takigawa et al. | 257/98 |
| 7,521,862 B2 * | 4/2009 | Mueller et al. | 313/506 |
| 7,858,408 B2 * | 12/2010 | Mueller et al. | 438/27 |
| 2005/0269582 A1 | 12/2005 | Mueller et al. | |
| 2006/0105485 A1 | 5/2006 | Basin et al. | |
| 2006/0281203 A1 | 12/2006 | Epler et al. | |
| 2008/0061312 A1 | 3/2008 | Gao et al. | |
| 2008/0218759 A1 | 9/2008 | Colvin et al. | |
| 2009/0256166 A1 * | 10/2009 | Koike et al. | 257/98 |
| 2010/0308354 A1 * | 12/2010 | David et al. | 257/98 |

FOREIGN PATENT DOCUMENTS

WO 2007085977 A1 8/2007

* cited by examiner

*Primary Examiner* — Calvin Lee
*Assistant Examiner* — Monica D Harrison

(57) ABSTRACT

An underfill formation technique for LEDs molds a reflective underfill material to encapsulate LED dies mounted on a submount wafer while forming a reflective layer of the underfill material over the submount wafer. The underfill material is then hardened, such as by curing. The cured underfill material over the top of the LED dies is removed using microbead blasting while leaving the reflective layer over the submount surface. The exposed growth substrate is then removed from all the LED dies, and a phosphor layer is molded over the exposed LED surface. A lens is then molded over the LEDs and over a portion of the reflective layer. The submount wafer is then singulated. The reflective layer increases the efficiency of the LED device by reducing light absorption by the submount without any additional processing steps.

15 Claims, 3 Drawing Sheets

US 8,431,423 B2

REFLECTIVE SUBSTRATE FOR LEDS

FIELD OF THE INVENTION

This invention relates to light emitting diodes (LEDs) and, in particular, to providing a reflective layer on a mounting surface.

BACKGROUND

LEDs are typically mounted on a submount wafer that is later diced to separate out the individual LEDs/submounts. Each submount portion of the wafer has top electrodes that are bonded to electrodes on the LED, such as by ultrasonic bonding. An underfill material, such as epoxy or silicone, is then injected under the LED to provide mechanical support and protect the LED from contaminants. Any underfill material substantially outside of the LED footprint (e.g., outside of 20 microns) is removed so that the submount surface is clean. One reason to remove the underfill material that extends beyond the LED die footprint is that, if the underfill is epoxy (starts off yellow) and is exposed to UV light, the epoxy turns black and absorbs light.

The submount also has a set of more robust electrodes, electrically connected by a metal pattern to the LED electrodes, that are typically bonded to a printed circuit board (after the submount wafer is diced) using conventional solder reflow or other means.

It is known to provide reflective metal electrodes on the bottom surface of the LEDs so that light emitted downward by the LED active layer is reflected upward rather than being absorbed by the submount. Some of the LED's emitted light also impinges on the submount surface surrounding the LED die footprint. To reflect that light, it is known to deposit a reflective metal ring around the LED, such as silver or aluminum.

Forming a metal reflector takes additional steps, and the metal must be insulated from the top metal pattern on the submount.

What is needed is a better way to reflect light upwards from the surface of a submount or other LED mounting surface.

SUMMARY

In one embodiment, a submount wafer is populated with LED dies. Instead of using a typical epoxy or silicone molding compound underfill for each LED die, a silicone molding compound containing $TiO_2$ powder as filler (or other white powder) is used as the underfill, and the underfill material also forms a substantially flat reflective layer surrounding each of the LEDs. In one embodiment, the underfill material is injection molded or compression molded over the wafer to form a layer of the underfill material over the entire wafer surface, including beneath each of the LEDs.

If the percentage, by weight, of $TiO_2$ exceeds about 5% of the total filler content of underfill material, the layer is over 85% reflective. If the underfill material contains 10% of total filler content, by weight, $TiO_2$, the layer is at least 90% reflective.

After the reflective $TiO_2$-infused layer is molded over the wafer (including below the LEDs), the exposed surface of the $TiO_2$-infused layer is then microbead blasted to expose the top surface of each LED. The surface of the $TiO_2$-infused layer surrounding the LEDs will be about at the same height as the LED semiconductor layers or less to form a reflective layer over the surface of the submount wafer. If the LED is a flip-chip, with a growth substrate on top after mounting on the submount, the growth substrate may then be removed. Since removal of the growth substrate puts a downward pressure on the LED semiconductor layers, the underfill supports the LED semiconductor layers during the substrate removal process.

If the LED light is to be phosphor-converted, a phosphor layer is then molded over the exposed LED surface or deposited by any other means.

A transparent lens is then molded over the LED, or formed using any suitable process.

Since an underfill material must be injected beneath the LEDs anyway, there is no extra process step in forming the underfill material to also create a reflective layer surrounding each of the LEDs on the submount. Therefore, the reflective layer around the LEDs increases the light output, by preventing absorption of light by the submount, without any additional process step. Mixing particles of $TiO_2$ into the silicone underfill material prior to molding it onto the submount is a simple step. The $TiO_2$ particles are small to maximize surface area vs. volume.

The submount wafer is then diced to separate out the individual LED/submounts, each having a reflective layer. The reflective layer is electrically insulating.

A preferred underfill material that can be used with the present process is a silicone molding compound, which has a glass transition temperature around $-10°$ C.$-20°$ C. and the coefficient of thermal expansion is close to the substrate, so that there is very little thermal expansion of the silicone molding compound under worst case conditions, such as during AuSn or AgSn solder reflow.

BRIEF DESCRIPTION OF THE DRAWINGS

Elements that are the same or equivalent are labeled with the same numeral.

DETAILED DESCRIPTION

As a preliminary matter, a conventional LED is formed on a growth substrate. In the example used, the LED is a GaN-based LED, such as an AlInGaN or InGaN LED, for producing blue light. Typically, a relatively thick n-type GaN layer is grown on a sapphire growth substrate using conventional techniques. The relatively thick GaN layer typically includes a low temperature nucleation layer and one or more additional layers so as to provide a low-defect lattice structure for the n-type cladding layer and active layer. One or more n-type cladding layers are then formed over the thick n-type layer, followed by an active layer, one or more p-type cladding layers, and a p-type contact layer (for metallization).

For a flip-chip, portions of the p-layers and active layer are etched away to expose an n-layer for metallization. In this way, the p contact and n contact are on the same side of the chip and can be directly electrically attached to the submount contact pads. Current from the n-metal contact initially flows laterally through the n-layer. The LED bottom electrodes are typically formed of a reflective metal.

Other types of LEDs that can be used in the present invention include AlInGaP LEDs, which can produce light in the red to yellow range. Non-flip-chip LEDs can also be used.

The LEDs are then singulated and mounted on a submount wafer.

Figure 1:
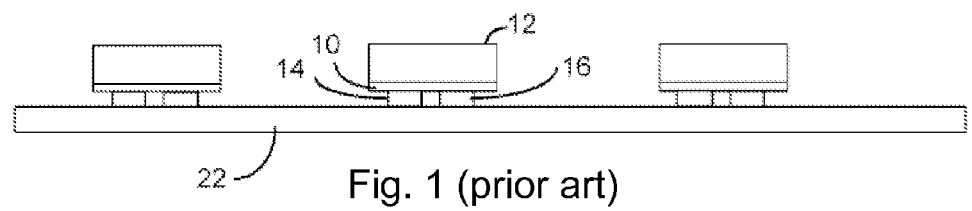
FIG. 1 illustrates a portion of a prior art submount wafer populated by an array of LEDs, such as 500-4000 LEDs, prior to an underfill step.

Prior art FIG. 1 illustrates a conventional LED 10 flip chip mounted on a portion of a submount wafer 22. The LED 10 is formed of semiconductor epitaxial layers grown on a growth substrate 12, such as a sapphire substrate. In one example, the epitaxial layers are GaN based, and the active layer emits blue light. Any other type of LED is applicable to the present invention.

Metal electrodes 14 are formed on the LED 10 that electrically contact the p-layer, and metal electrodes 16 are formed on the LED 10 that electrically contact the n-layer. In one example, the electrodes are gold bumps that are ultrasonically welded to anode and cathode metal pads on the submount wafer 22. The submount wafer 22, in one embodiment, has conductive vias leading to bottom metal pads for bonding to a printed circuit board. Many LEDs are mounted on the submount wafer 22, and the wafer 22 will be later singulated to form individual LEDs/submounts.

Further details of LEDs can be found in the assignee's U.S. Pat. Nos. 6,649,440 and 6,274,399, and U.S. Patent Publications US 2006/0281203 A1 and 2005/0269582 A1, all incorporated herein by reference.

A reflective underfill material is prepared. In one embodiment, particles of $TiO_2$ (appearing white under white light), or other reflective particles such as $ZrO_2$, are added to a silicone molding compound that is suitable for underfilling. A typical silicone molding compound contains about 82%-84% $SiO_2$ by weight, which creates a very stable material in the high-photon energy, high-heat environment of a power LED. To create the reflective properties of the underfill, $TiO_2$ is included in the silicone molding compound to replace some of the $SiO_2$ to cause the $TiO_2$ to be about 5-10% or higher by weight of the total amount of filler in silicone molding compound. The $TiO_2$ plus the $SiO_2$ should equal about 80%-84% by weight of the silicone compound. A 5% addition of $TiO_2$ results in about an 85% reflectivity of the silicone compound, and a 10% addition of $TiO_2$ results in over 90% reflectivity of the silicone compound. Significantly more $TiO_2$ begins to reduce the desirable characteristics of the silicone compound for used as an underfill. Other formulations of an electrically insulating, reflective underfill material may be used.

Figure 2A:
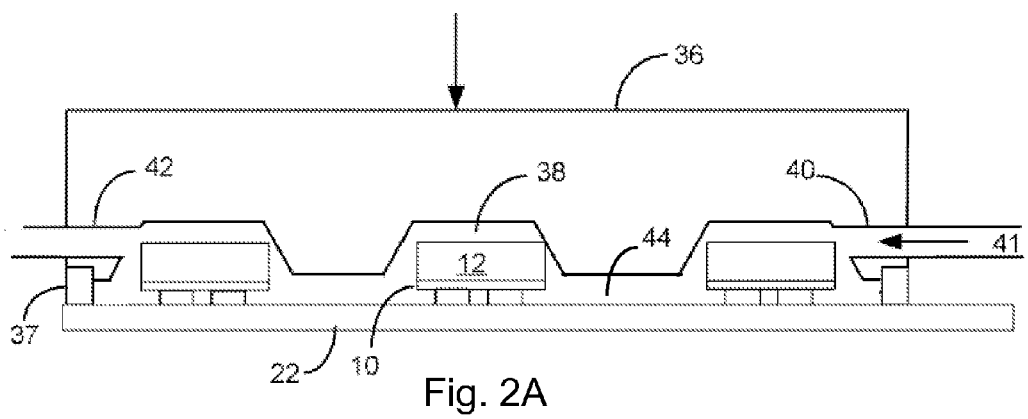
FIG. 2A illustrates a wafer-level injection molding process used to provide a reflective underfill material below the LEDs and over the surface of the submount wafer.

FIG. 2A illustrates one type of suitable injection molding process for creating the underfill and reflective layer for each LED. A mold 36 has cavities 38 that define the shape of the hardened underfill material after the molding process. The mold 36 may be formed of aluminum. The mold 36 has a perimeter seal 37 that seals against the submount wafer 22 when the mold 36 is aligned with the wafer 22 and pressed against the wafer 22.

The mold 36 has at least one inlet 40, for injecting the reflective liquid underfill material 41, and at least one outlet 42 connected to a vacuum source. Once the mold 36 is sealed against the wafer 22, a vacuum is created within the mold 36, and the underfill material 41 is injected through inlet 40. The underfill material 41 flows into all the cavities 38 via channels 44 between the cavities, assisted by the vacuum and the injection pressure of the material 41. The vacuum removes almost all the air in the mold 36. Ultimately, the entire mold 36 will be filled with the underfill material 41, including all voids under the LEDs.

The mold 36 is then heated to cure the liquid underfill material. The temperature of the mold 36 during curing is about 150° C. Alternatively, a transparent mold may be used and the underfill material may be cured with UV light.

Figure 2B:
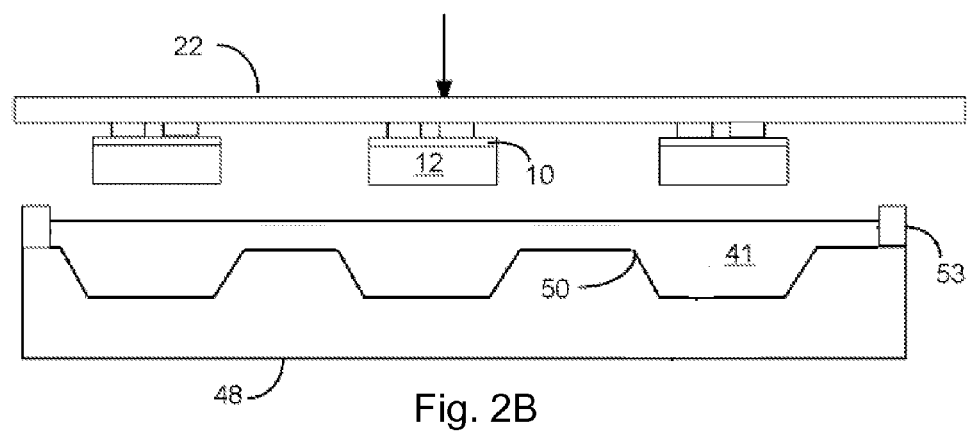
FIG. 2B illustrates an alternative type of wafer-level molding process, not using injection, to provide a reflective underfill material below the LEDs and over the surface of the submount wafer.

FIG. 2B illustrates an alternative wafer-level molding process that does not use pressure injection of the underfill material. In FIG. 2B, the mold 48 has cavities 50 that are first filled with particles (e.g., powder or small tablets) of solid underfill material 41 at atmospheric pressure. The solid material is then heated in the mold to soften it. The submount wafer 22 is brought against the mold 48 so that the LEDs are immersed in the underfill material in each cavity 50. The wafer 22 and mold 48 are pressed together to force the underfill material to fill all voids. A perimeter seal 53 allows the pressure to be high while allowing all air to escape as the underfill material fills the voids. A vacuum may also be pulled between the wafer 22 and the mold 48 using a vacuum source around the seal 53.

The mold 48 is then cooled to solidify the underfill material. Certain materials harden automatically after the heating and compression process. Handling the underfill material as a solid has various benefits. Further, some suitable materials that can be used for an underfill are not a liquid at room temperatures prior to curing, so heating up a solid material in the mold followed by compression greatly increases the number of possible materials that can be used as an underfill.

Figure 3:
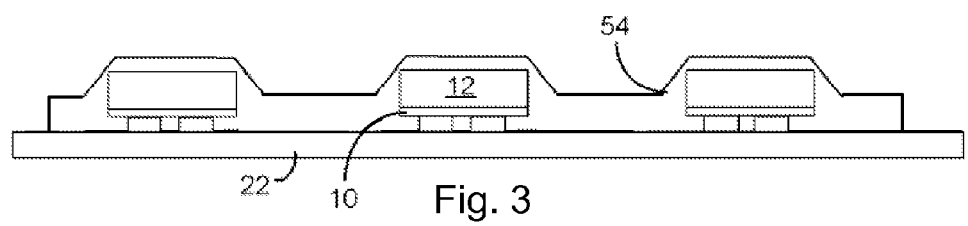
FIG. 3 illustrates the LEDs on the wafer after being removed from the mold of FIG. 2A or FIG. 2B.

The mold of FIG. 2A or 2B is then removed from the wafer 22, resulting in the structure of FIG. 3, having the hardened underfill material 54 encapsulating each LED. There is also a layer of hardened underfill material 54 on the wafer 22 surface between each LED.

To perform a laser lift-off process to remove the growth substrates 12, the underfill material 54 over the growth substrate 12 must first be removed. If the growth substrate 12 will be removed by grinding or another mechanical etch process, such grinding may be used to simultaneously remove the excess underfill material 54.

Figure 4:
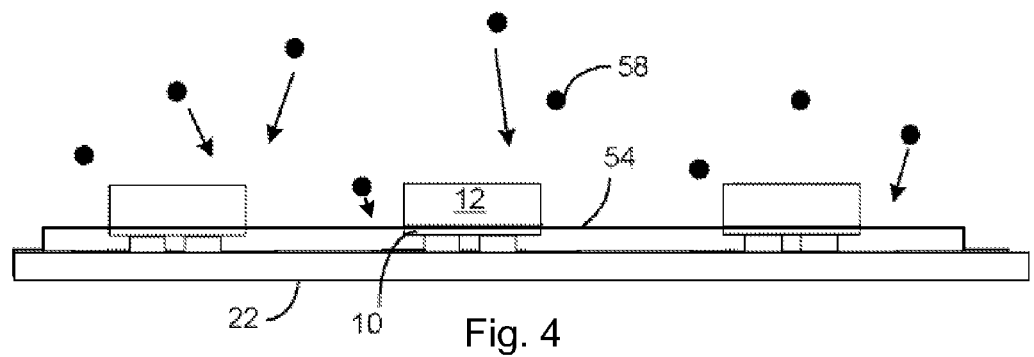
FIG. 4 illustrates the surface of the underfill material of FIG. 3 being etched away by microbead blasting so as to expose the top surface of the LEDs yet leave a reflective layer over the surface of the submount wafer.

FIG. 4 illustrates the removal of the excess underfill material 54 by blasting the entire surface of the wafer 22 with high-velocity microbeads 58. In one embodiment, the microbeads 58 have diameters between 1-20 microns and are formed of $NaHCO_3$. The microbeads 58 are accelerated through a nozzle by air at a pressure of about 100 psi or less. The nozzle may be large to etch the underfill material 54 from over the LEDs 10 without the nozzle moving, or a smaller nozzle may be used to etch the underfill material 54 off only a few LEDs at a time followed by the nozzle moving to a next position over the wafer 22. Removing excess material of any kind using microbeads is a known process. The underfill material 54 is etched to leave a reflective layer over the submount surface between the LEDs 10. The thickness of the remaining layer should be sufficient to reflect at least 80% of the impinging light. In one embodiment, the thickness of the reflective layer over the submount surface is about 30-50 microns (which may be approximately the thickness of the underfill beneath the LED die), and the overall top surface of the reflective layer is substantially flat, as determined by the mold shape and effects of the microbead blasting.

Figure 5:
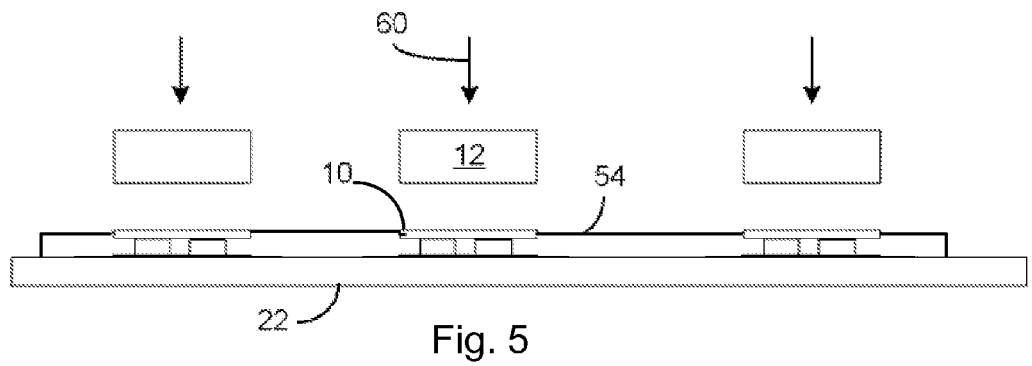
FIG. 5 illustrates a laser lift-off technique for removing the growth substrates from the LEDs.

FIG. 5 illustrates a laser lift-off process. The laser pulses are shown by arrows 60. During the laser lift-off, the surface of the GaN absorbs heat, causing the surface layer to decompose into the Ga and $N_2$. The $N_2$ pressure pushes the sapphire growth substrates 12 away from the LEDs. After the growth substrates 12 become detached from the semiconductor LED layers during the lift-off process, they are removed by, for example, an adhesive sheet or some other suitable process. The underfill mechanically supports the thin LED semiconductor layers during the lift-off process.

The exposed LED layers are then thinned by, for example, RIE or a mechanical etch, since the exposed top layer is a relatively thick n-layer, and the surface has been damaged by the laser lift-off process. The resulting top surface may then be roughened to increase the light extraction efficiency.

If it is desired to create phosphor-converted light, a mold similar to mold 48 in FIG. 2B is then provided to mold a phosphor layer over the LEDs 10. For example, the LEDs 10 may emit blue light and it may be desired to create white light by depositing a layer of YAG phosphor (generates yellow light) or a layer of red and green phosphors. The blue light leaks through the phosphor to combine with the phosphor-generated light.

Figure 6:
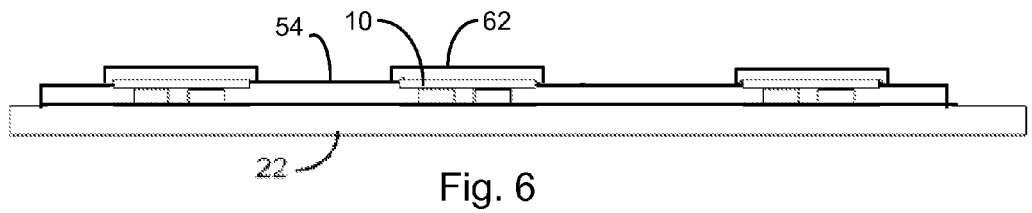
FIG. 6 illustrates a phosphor layer (phosphor particles in a binder) formed over the exposed LED surfaces by a molding process similar to that of FIG. 2B.

The phosphor mixture may be phosphor particles infused in a binder such as silicone. The mold cavities then define the shape of the phosphor over the LEDs 10, and the phosphor mixture is cured to harden the phosphor layer. FIG. 6 illustrates a molded phosphor layer 62 over the LEDs. If the tolerances of the mold process cause there to be a thin phosphor layer over the underfill material 54, such thin phosphor may be removed using a microbead blasting step.

Figure 7:
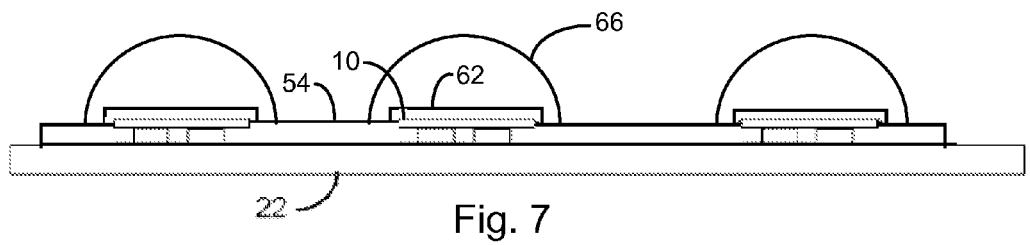
FIG. 7 illustrates a lens formed over the LEDs by a molding process similar to that of FIG. 2B.

A transparent lens 66 (FIG. 7) may then be molded over each LED 10 to increase the light extraction from the LED, protect the phosphor layer 62 and the LED 10, and create a desired light emission pattern. The lens 66 may be any shape, such as the hemispherical shape shown in FIG. 7. In one embodiment, the lens 66 is molded from silicone using the same general process shown in FIG. 2B.

In one embodiment, the lens material also contains phosphor particles to wavelength convert the light emitted by the LEDs 10.

Other wafer-level processes may also be performed on the LED array while mounted on the submount wafer 22.

Figure 8:
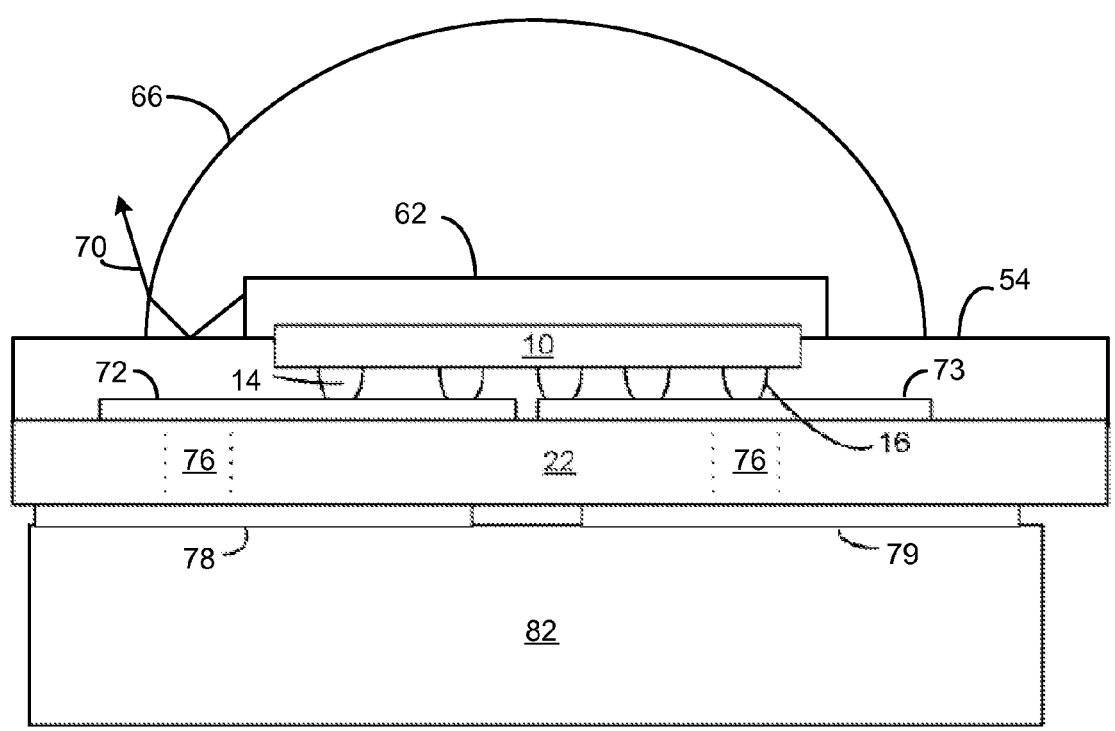
FIG. 8 is a cross-sectional view of a single LED mounted on a submount after the LEDs/submounts of FIG. 7 have been singulated. The submount is shown soldered to a printed circuit board.

The submount wafer 22 is then singulated to form individual LEDs/submounts, such as shown in FIG. 8. As shown in FIG. 8, the entire surface of the submount wafer 22 portion is covered by the reflective underfill material 54. A light ray 70 is shown being emitted by the phosphor layer 62 in a downward direction and being reflected upward by the underfill material 54. Light rays from the sides of the LED 10 will also be reflected upward and exit through the top surface of the underfill material 54.

FIG. 8 also shows the electrodes 72 and 73 on the surface of the submount wafer 22 portion, the vias 76 leading to the bottom electrodes 78 and 79, and a printed circuit board 82 having pads soldered to the electrodes 78 and 79. The board 82 may have an aluminum core for sinking heat.

The invention also applies to forming a reflective material around LEDs mounted on a substrate whether or not the reflective material is also used as an underfill. For example, the bottom electrodes on the LED may take up virtually the entire backside of the LED and an underfill may not be needed.

Details of a wafer-level lens molding process are described in Patent Publication US 2006/0105485, entitled Overmolded Lens Over LED Die, by Grigoriy Basin et al., assigned to the present assignee and incorporated herein by reference.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for fabricating a light emitting device comprising:
   providing a light emitting diode (LED) die on a submount, there being a gap between the LED die and the submount, the LED die having a bottom surface facing the submount and a top surface opposite the bottom surface;
   providing a reflective underfill material comprising silicone containing reflective particles;
   molding the underfill material over the surmount so that the underfill material substantially completely fills the gap between the LED die and the submount and forms a layer of the underfill material over the submount surrounding the LED die; and
   removing any underfill material over a top surface of the LED die while leaving at least a portion of the layer of the underfill material over the submount surrounding the LED die to create a substantially flat reflective layer of the underfill material surrounding the LED die.

2. The method of claim 1 wherein the LED die comprises epitaxial layers grown on a growth substrate, wherein a surface of the growth substrate is the top surface of the LED die, the method further comprising removing the growth substrate from the epitaxial layers after removing any underfill material over the top surface of the LED die.

3. The method of claim 1 further comprising molding a phosphor layer over the LED die, wherein a top surface of the phosphor layer extends above a top surface of the reflective layer.

4. The method of claim 1 wherein the underfill material comprises silicone infused with $TiO_2$, and a reflectivity of the reflective layer to visible light is greater than about 80%.

5. A light emitting device comprising:
   a light emitting diode (LED) die comprising epitaxially grown semiconductor layers having a top surface that emits light;
   a submount on which the LED die is mounted;
   a phosphor layer over the LED die;
   a reflective layer of silicone, having a substantially planar surface with respect to the submount, infused with reflective particles extending over a top surface of the submount surrounding the LED die for reflecting at least light from the phosphor layer, but not above the top surface of the semiconductor layers, the silicone also being located below the LED die between the LED die and the submount and being contiguous with the silicone surrounding the LED die; and
   a lens molded over the LED die, the phosphor layer, and a portion of the reflective layer.

6. A light emitting device comprising:
   a light emitting diode (LED) die comprising epitaxially grown semiconductor layers having a top surface that emits light;
   a submount on which the LED die is mounted, there being a gap between the LED die and the submount; and an electrically insulating underfill material located below the LED die between the LED die and the submount, the underfill material also extending beyond a perimeter of the LED die but not above the top surface of the semiconductor layers, the underfill material extending beyond the perimeter of the LED die being contiguous with the underfill material located below the LED die, the underfill comprising an insulating material infused with reflective particles, the underfill material extending beyond the perimeter of the LED die forming a reflective layer, having a substantially planar surface with respect to the submount, surrounding the LED die over a surface of the submount.

7. The device of claim 6 wherein the underfill material comprises silicone infused with $TiO_2$.

8. The device of claim 7 wherein the $TiO_2$ comprises more than about 5% by weight of the underfill material.

9. The device of claim 6 further comprising a phosphor layer over the LED die, the phosphor layer having a surface extending above the reflective layer.

10. The device of claim 6 wherein the reflective layer extends to edges of the submount.

11. The device of claim 6 wherein a thickness of the underfill material between the LED die and the submount is less than a thickness of the reflective layer.

12. The device of claim 6 wherein a thickness of the reflective layer is greater than 30 microns.

13. The device of claim 6 wherein a reflectivity of the reflective layer to visible light is greater than about 80%.

14. The device of claim 6 wherein the underfill material comprises silicone infused with the reflective particles.

15. The device of claim 6 further comprising a transparent lens molded over the LED die and a portion of the reflective layer.

* * * * *